United States Patent
Hsu et al.

(10) Patent No.: US 9,942,999 B2
(45) Date of Patent: Apr. 10, 2018

(54) ELECTRICAL CONNECTOR ASSEMBLY WITH HOLDING MEMBER

(71) Applicant: FOXCONN INTERCONNECT TECHNOLOGY LIMITED, Grand Cayman (KY)

(72) Inventors: Shuo-Hsiu Hsu, New Taipei (TW); Hao-Yun Ma, San Jose, CA (US)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 15/069,976

(22) Filed: Mar. 15, 2016

(65) Prior Publication Data
US 2016/0197421 A1 Jul. 7, 2016

Related U.S. Application Data

(63) Continuation-in-part of application No. 14/320,892, filed on Jul. 1, 2014, now Pat. No. 9,337,573.

(51) Int. Cl.
| | |
|---|---|
| *H01R 13/627* | (2006.01) |
| *H01R 13/629* | (2006.01) |
| *H05K 7/10* | (2006.01) |
| *H01L 23/40* | (2006.01) |

(52) U.S. Cl.
CPC ........... *H05K 7/1061* (2013.01); *H01L 23/40* (2013.01); *H01L 23/4093* (2013.01)

(58) Field of Classification Search
CPC .......... H01R 13/6272–13/6277; H01R 13/639; H01R 13/62; H01R 13/4226; H01R 13/20; H01R 13/236

USPC .... 439/607.35, 485, 487, 68, 489, 325–330, 439/67, 71, 60, 407, 345, 78, 366, 376, 439/83, 261, 298, 299, 308–312
See application file for complete search history.

(56) References Cited

U.S. PATENT DOCUMENTS

| | | | | |
|---|---|---|---|---|
| 5,178,557 A | * | 1/1993 | Hashiguchi | ........ H01R 12/7029 439/357 |
| 5,218,585 A | * | 6/1993 | Aviles | .................. G11B 33/121 369/44.14 |

(Continued)

FOREIGN PATENT DOCUMENTS

TW        M429188        5/2012

*Primary Examiner* — Michael A Lyons
*Assistant Examiner* — Milagros Jeancharles
(74) *Attorney, Agent, or Firm* — Wei Te Chung; Ming Chieh Chang

(57) ABSTRACT

An electrical connector assembly, adapted for electrically connecting an IC package to a printed circuit board, includes a first housing used for soldering on the printed circuit board and a frame surrounding the first housing. The first housing includes a longitudinal body and a protrusion projecting forwardly from the body. The frame defines a base and two supporting arms extending from two ends of the base, each supporting arm defines a latching bent from a top edge of a free end thereof for locking the protrusion of the first housing. The electrical connector assembly includes a longitudinal holding member, the holding member has two ends respectively connecting to the free ends of said two supporting arms so that the dimension of the opening formed between the free ends of said two supporting arms is fixed.

13 Claims, 8 Drawing Sheets

(56) References Cited

U.S. PATENT DOCUMENTS

| | | | | |
|---|---|---|---|---|
| 5,409,385 A * | 4/1995 | Tan | G06K 19/077 | 439/76.1 |
| 5,690,502 A * | 11/1997 | Mochizuki | H01R 12/83 | 439/320 |
| 5,694,314 A * | 12/1997 | Aoki | G11B 7/0037 | 720/652 |
| 5,803,761 A * | 9/1998 | Mochizuki | H01R 12/83 | 439/326 |
| 5,997,331 A | 12/1999 | Tu | | |
| 6,027,357 A * | 2/2000 | Howell | H05K 7/1454 | 439/326 |
| 6,129,522 A * | 10/2000 | Seo | F04B 39/0061 | 417/312 |
| 6,570,763 B1 * | 5/2003 | McHugh | H01L 23/4093 | 165/185 |
| 6,669,494 B2 * | 12/2003 | Abe | G06K 13/08 | 439/159 |
| 6,735,085 B2 * | 5/2004 | McHugh | H01L 23/4093 | 24/458 |
| 6,796,831 B1 * | 9/2004 | Yasufuku | H05K 7/1431 | 439/160 |
| 6,866,530 B1 * | 3/2005 | Yen-Lin | H01R 12/83 | 439/326 |
| 6,881,085 B2 * | 4/2005 | Yahiro | H01R 12/721 | 439/326 |
| 6,908,345 B2 | 6/2005 | Shimizu et al. | | |
| 6,976,879 B2 * | 12/2005 | Shishikura | G06K 7/0021 | 439/630 |
| 7,180,744 B2 * | 2/2007 | Chen | H01L 23/4093 | 165/80.3 |
| 7,326,085 B2 * | 2/2008 | Takai | G06K 7/0034 | 439/138 |
| 7,371,100 B1 * | 5/2008 | Polnyi | H05K 7/1053 | 439/331 |
| 7,427,208 B2 * | 9/2008 | Yang | H01R 12/7052 | 439/326 |
| 7,486,523 B2 * | 2/2009 | Wu | H05K 7/1431 | 361/740 |
| 7,493,937 B2 * | 2/2009 | Chen | H01L 23/4093 | 165/80.2 |
| 7,578,703 B2 * | 8/2009 | Hsiao | G06K 7/0021 | 439/159 |
| 7,717,728 B1 * | 5/2010 | Wang | H01R 12/7029 | 439/328 |
| 7,914,313 B1 * | 3/2011 | Ramsey | G01R 1/0466 | 439/330 |
| 8,282,409 B2 * | 10/2012 | Ma | G06K 7/0021 | 439/328 |
| 8,597,057 B2 * | 12/2013 | Yu | H01R 13/635 | 439/159 |
| 9,048,569 B2 * | 6/2015 | Chen | H01R 12/716 | |
| 9,118,141 B2 * | 8/2015 | Yeh | H01R 13/533 | |
| 9,478,885 B2 * | 10/2016 | MacDougall | H01R 12/73 | |
| 9,509,073 B2 * | 11/2016 | Hsu | H01R 12/7076 | |
| 2008/0192425 A1 * | 8/2008 | Ni | H05K 5/0256 | 361/679.01 |
| 2010/0055985 A1 * | 3/2010 | Hu | H01R 13/2442 | 439/626 |
| 2010/0228621 A1 * | 9/2010 | Hochhalter | G06Q 30/02 | 705/14.44 |
| 2010/0261371 A1 * | 10/2010 | Morinari | G01R 1/0483 | 439/331 |
| 2012/0064753 A1 * | 3/2012 | Qiao | G06F 1/185 | 439/345 |
| 2015/0270642 A1 * | 9/2015 | Cheng | H01R 13/6271 | 439/342 |
| 2015/0349441 A1 | 12/2015 | Hsu | | |
| 2015/0349442 A1 | 12/2015 | Hsu | | |

* cited by examiner

ELECTRICAL CONNECTOR ASSEMBLY WITH HOLDING MEMBER

The instant application is a CIP (Continuation-in-Part) application of the copending application Ser. No. 14/320,892 filed Jul. 1, 2014 which discloses two sets of locking mechanism around a front opening of the metallic bracket/frame to retain the detachable optical module in a vertical direction and a front-to-back direction perpendicular to each other, respectively, so as to allow the user to load the optical module in the vertical direction and unload the optical module in the front-to-back direction.

BACKGROUND OF THE INVENTION

1. Field of the Invention

The present invention relates to an electrical connector assembly, more particularly to an electrical connector assembly adapted for electrically connecting an IC package to a printed circuit board.

2. Description of Related Art

Current electrical connector assembly as disclosed in the parent application Ser. No. 14/320,892 with same applicant/assignee and the same inventors and being a parent application of the instant application, adapted for high speed signals transmitting between IC packages, comprises a first body mounted on the printed circuit board, an insulative base received in front portion of the first body and a second body engaging with the insulative base and supporting the IC package. There is a bracket surrounding the outside of the first body, the bracket is made of a metallic material and includes a substrate and a pair of supporting arms extending from the opposite sides of the substrate. The supporting arms are disposed on both sides of the first body and each defines a locking portion, i.e., a latch 110 disclosed in the parent application Ser. No. 14/320,892, bending inwardly from the upper side of the free end of the supporting arm and clasping a projection of the first body. However, there is preferably a floating connection in the vertical direction between the supporting arms of bracket and the first body for assuring coplanarity between bracket and the first body so that the size of the opening formed between the locking portions of the two supporting arms of the bracket will become uncertain; at the same time, the locking portions of the support arms of the bracket still need to provide a good locking and retaining effect for an attachment element, e.g., an optical module. When the size, i.e., the transverse dimension, of the opening becomes too large, the bracket will lose the retaining effect to the attachment element. Another factor affecting the precise/correct size of the opening between the two locking portions of the supporting arms is that the bracket is made by forming/bending the relatively thin sheet metal rather than the relatively rigid die-casting. Understandably, forming/bending the sheet metal inherently leads to a relatively high deviation at the free end(s) far from the base, thus easily failing to efficiently control the correct wide size of the opening between the locking portions of the two supporting arms.

An improved electrical connector assembly is desired to efficiently guarantee the correct width between the locking portions of the two supporting arms in the transverse direction before the two supporting arms are soldered upon the printed circuit board. Therefore, the correct width between the locking portions of the two supporting arms in the transverse direction is also assured after the supporting arms of the bracket are soldered upon the printed circuit board.

BRIEF SUMMARY OF THE INVENTION

According to one aspect of the present invention, an electrical connector assembly, adapted for electrically connecting an IC package to a printed circuit board, includes a first housing used for soldering on the printed circuit board and a frame surrounding the first housing. The first housing includes a longitudinal body and a protrusion projecting forwardly from the body. The frame defines a base and two supporting arms extending from two ends of the base, each supporting arm defines a latching bent from a top edge of a free end thereof for locking the protrusion of the first housing. The electrical connector assembly includes a longitudinal holding member, the holding member has two ends respectively connecting to the free ends of said two supporting arms so that the dimension of the opening formed between the free ends of said two supporting arms is fixed.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE PREFERRED EMBODIMENTS

In the following description, numerous specific details are set forth to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

The electrical connector assembly 100 as show in FIG. 1 to FIG. 6, is used for electrically connecting an IC package (not shown) to a printed circuit board 200. The IC package is received in the electrical connector assembly 100, and a heat sink 300 is mounted above the IC package to disperse heats.

Figure 1:
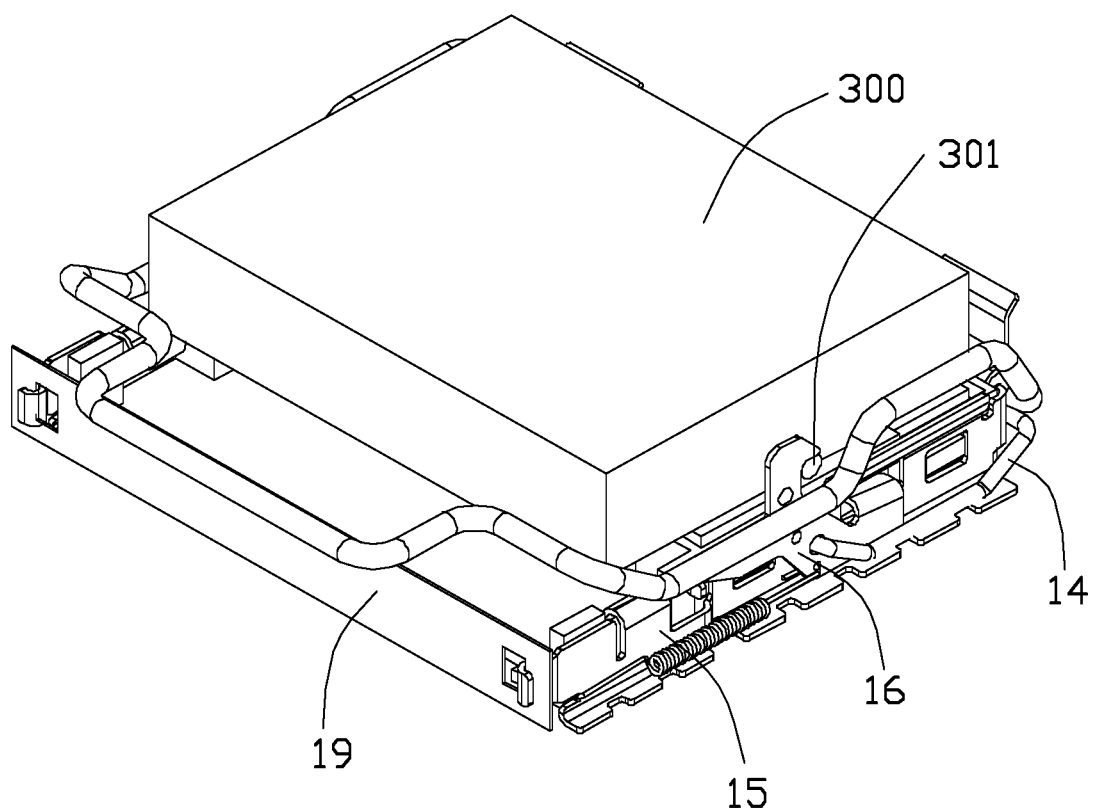
FIG. 1 is a perspective view of the electrical connector assembly in accordance with present invention, and a heat sink is loaded on the electrical connector assembly.
Figure 2:
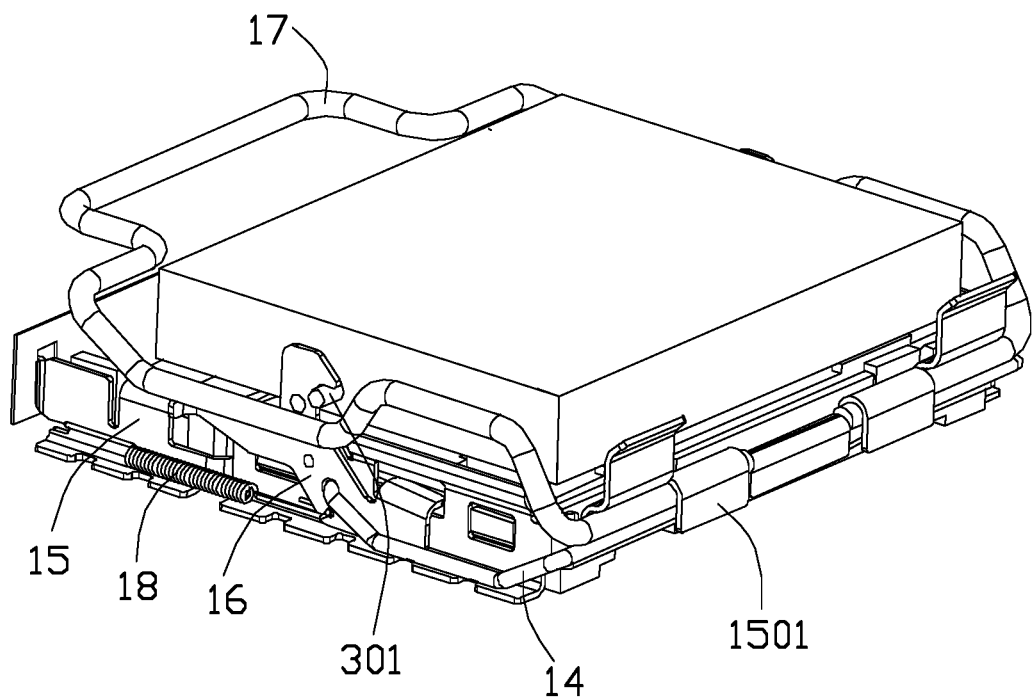
FIG. 2 is another perspective view of the electrical connector assembly shown in FIG. 1.
Figure 3:
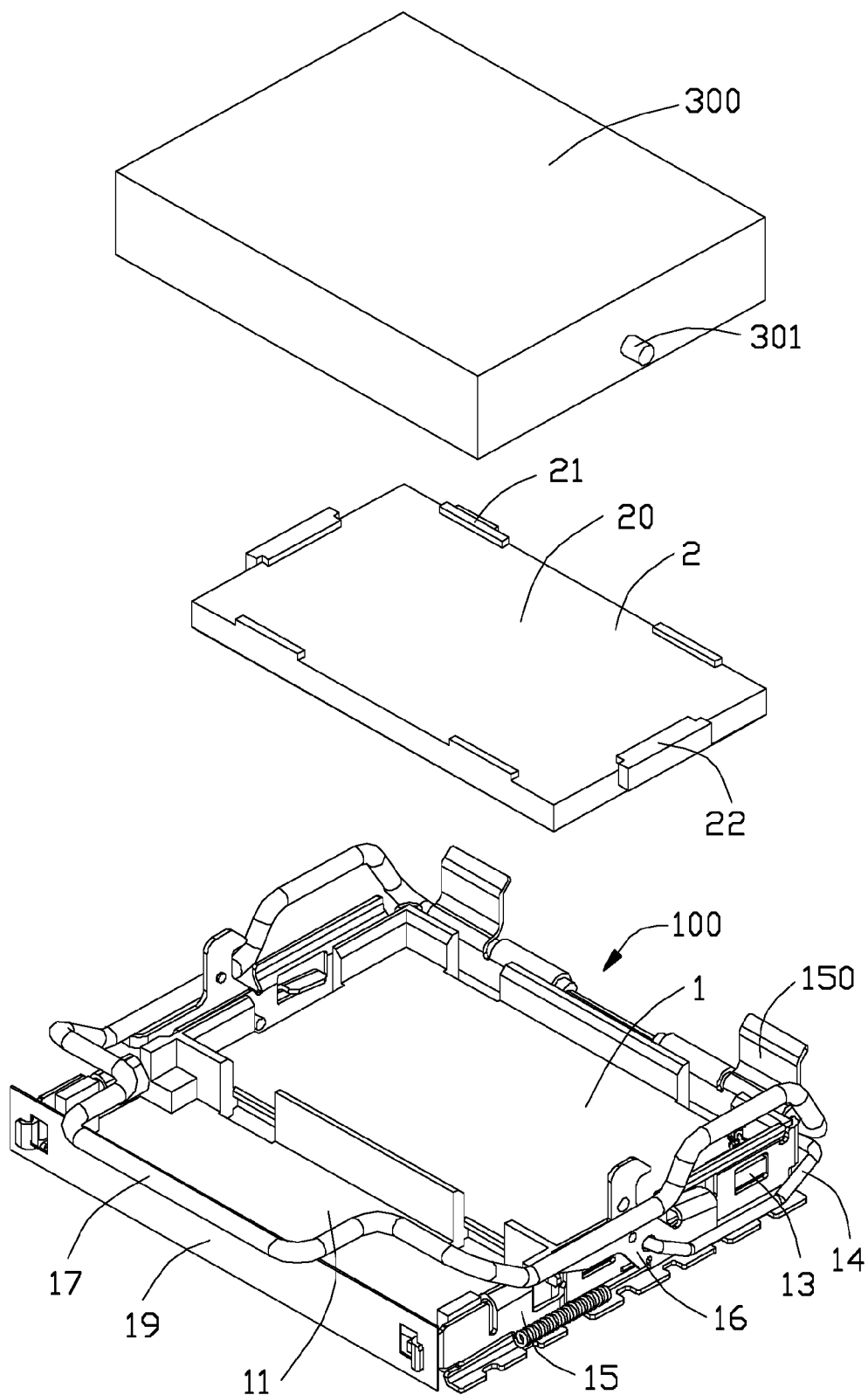
FIG. 3 is a partly explored perspective view of the electrical connector assembly shown in FIG. 1.
Figure 4:
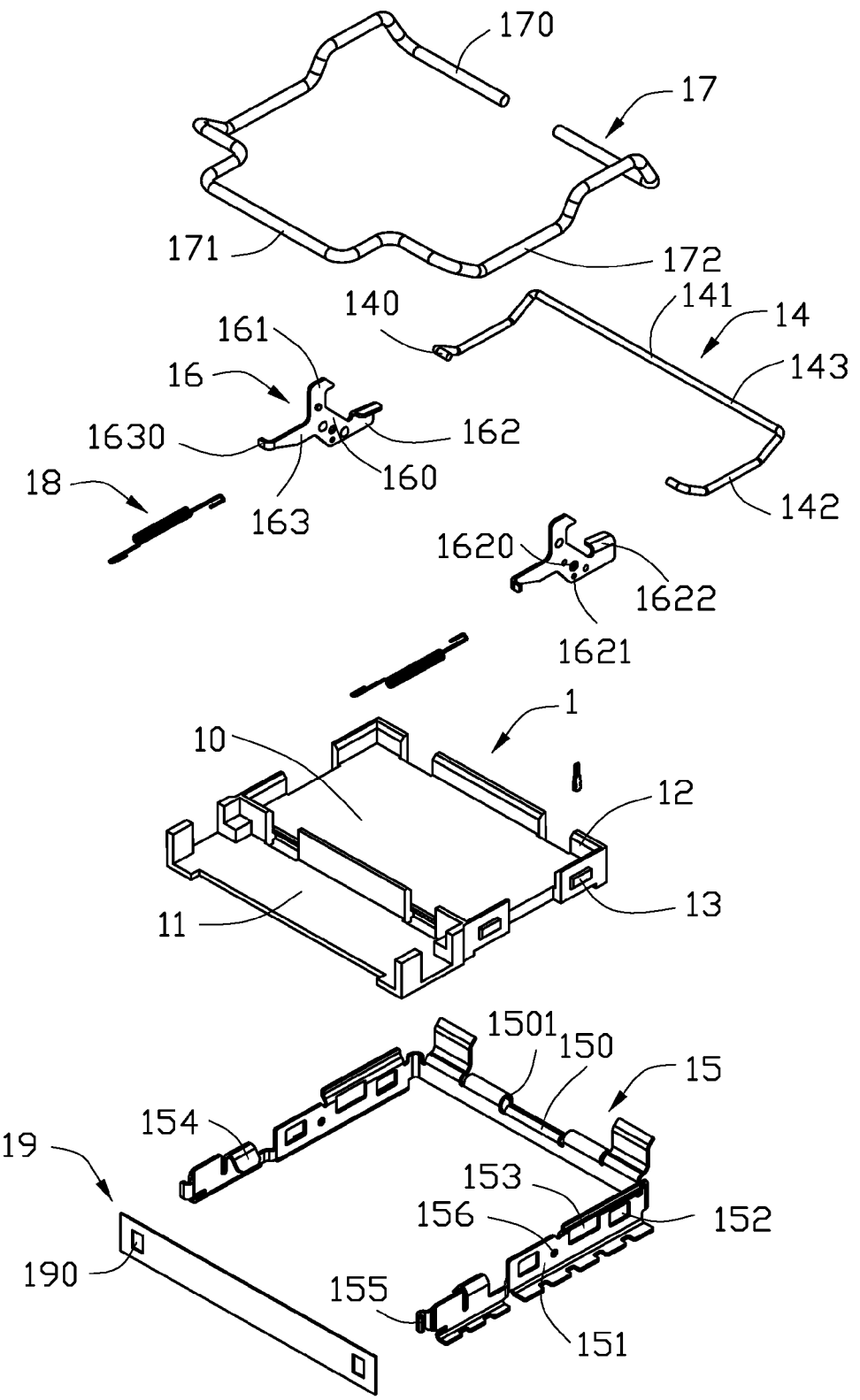
FIG. 4 is an explored perspective view of a part of the electrical connector assembly shown in FIG. 3.
Figure 5:
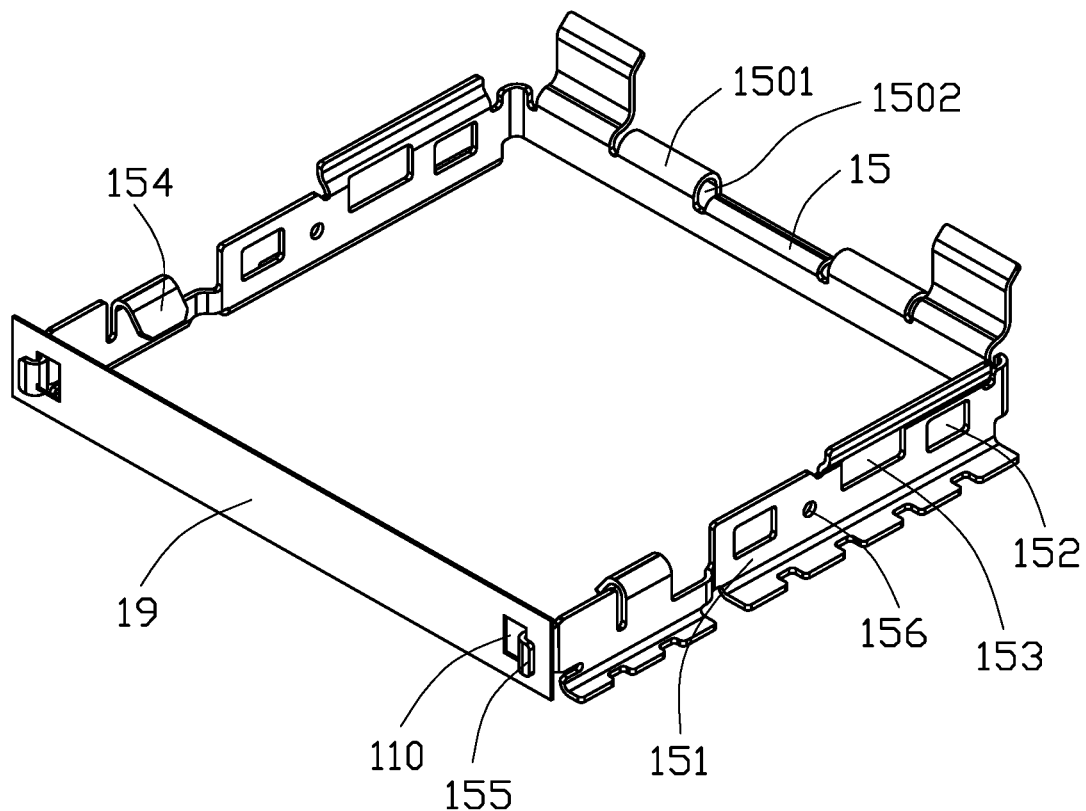
FIG. 5 is a perspective view of a frame and a holding member of the electrical connector assembly shown in FIG. 3.

Referring to FIG. 3 to FIG. 4, the electrical connector assembly 100 has a first insulative housing 1 mounted to a printed circuit board and a second insulative housing 2 mounting upon the first insulative housing 1. The electrical connector assembly 100 further has a pivot haulm 14, a frame or bracket 15 surrounding the first housing 1, two locking members 16 rotatably assembled on two sides of the frame 15 via the pivot haulm 14 pivoting to the frame 15, a lever 17, and two springs 18 retained between the locking members 16 and the frame 15.

The first housing 1 includes a longitudinal body 10 and a protrusion 11 protruding forwardly from the body 10, and the body 10 defines a plurality of receiving holes (not shown) running through the body 10 along a top to bottom direction, a peripheral sidewall 12 extending upwardly from a peripheral of the body 10 and a plurality of ribs 13 formed on an outside of the sidewall 12. A plurality of first contacts (not shown) are received in the receiving holes. The second housing 2 defines a top surface for loading the IC package (not shown), has a longitudinal body 20, a plurality of receiving slots (not shown) running through the body 20 along the top to bottom direction, a plurality of positioning portions 21 and two clumps 22. The two clumps 22 protrude upwardly and outwardly from two opposite edges of the body 20, respectively, for positioning the IC package. The receiving slots of the second housing 2 are aligned with corresponding receiving holes of the first housing 1. A plurality of second contacts (not shown) are received in the receiving slots and mate with the first contacts of the first housing 1.

The locking member 16 is cut from a metal material and has a main body 160, a claw 161 extending backwardly from a top of the main body 160, an extending arm 162 extending backwardly from a bottom of the main body 160 and a supporting portion 163 extending forwardly from the main body 160. The supporting portion 163 has a hook 1630 laterally bent from a front end thereof, the claw 161 and the supporting portion 163 are located on two opposite sides of the main body 160, and the extending arm 162 and the claw 161 are located on the same side of the main body 160. The main body 160 defines a circular hole 1620 through which the pivot haulm 14 passes and a retaining hole 1621 latching with the spring 18. The extending arm 162 is formed with a pushing portion 1622 bent inwardly toward the first housing 1.

The frame 15 is formed by metallic material and is of a U shape. The frame 15 has a base 150 and two supporting/locking arms 151 bent from two ends of the base 150. Each supporting arm 151 defines two through holes 152 for receiving the ribs 13 of the first housing 1, a slot 153 and a pivoting hole 156 located between the two through holes 152. The slot 153 is used for receiving the pushing portion 1622 of the locking member 16, and the pivoting hole 156 is defined for assembling the pivot haulm 14. The supporting arm 151 further defines a deflectable latching 154 bent from a top edge of a free end thereof and a deflectable locking portion 155 bent from a front edge of the free end thereof, wherein as referred to FIG. 8 and as disclosed in the parent application Ser. No. 14/320,892, the latching 154 allows downward loading of the optical module 90 into the first housing 1 in the vertical direction and further latches the optical module in the vertical direction, while the locking portion 155 latches the attachment element in the front-to-back direction and allows unloading the optical module from the first housing 1 in the front-to-back direction.

The pivot haulm 14 has two ends 140 and a connecting portion 141 connecting the ends 140, the two ends 140 extend inwardly toward each other and pivot the haulm 14 to a rear side of the frame 15 opposite to the lever 17, and the connecting portion 141 has two side arms 142 connecting with the ends 140 respectively and a connecting part 143 connecting the two side arms 142. The frame 15 has a clasp 1501 bent rearward and downwardly from a top edge of the base 150 to define a receiving space 1502 with the main base 150, the pivot haulm 14 is assembled in the receiving space 1502. A horizontal part of the side arm 142 of the haulm 14 seats on a bottom wings extending from the frame 15, so the haulm 14 is in a balanced status.

The lever 17 can force the supporting portion 163 to downwardly rotate and bring the extending arm 162 to upwardly move. The lever 17 is made from a metallic pole, and has an operating portion 171, two pressing portions 172 bent rearward from two opposite ends of the operating portion 171 and two ends 170 bent inwardly from free ends of the pressing portions 172 and toward each other. The pivoting end 170 is also received in the receiving space 1502 of the frame 15 and is limited by the clasp 1501 of the frame 15 and the connecting part 143 of the haulm 14, by this arrangement, the lever 17 can rotate around the pivoting ends 170. The pressing portions 172 can force the supporting portion 163 of the locking member 16 downwardly rotate and bring the extending arm 162 to upwardly move.

When assemble the electrical connector assembly 100, firstly, mount the second housing 2 upon the first housing 1, put the frame 15 and the holding member 19 around the connectors 1, 2, wherein the ribs 14 of the first housing 1 are received in the through holes 152 of the frame 15, the latching 154 of the frame 15 is locking the protrusion 11 of the first housing 1, and the locking portions 155 are clasping the locking holes 190 of the holding member 19. Then put the connecting part 143 of the haulm 14 in the receiving space 1502 of the frame 15, and make the ends 140 of the haulm 14 pass through the circular hole 1620 of the locking member 16 and insert into the pivoting hole 156 of the frame 15 so as to assemble the locking members 16 to the frame 15. The pushing portion 1622 passes through the slot 153 of the frame 15 and arrives an underside of the clump 22 of the second housing 2. Next, assemble the lever 17 to the frame 15, the ends 170 are received in the receiving space 1502 of the frame 15 and supported by the connecting part 143 of the haulm 14, and the pressing portion 172 seats on the hook 1630 of the locking member 16; latch one end of the spring 18 with the locking member 16, and latch the other end of the spring 18 to a gap defined on a front end of the frame 15.

Figure 6:
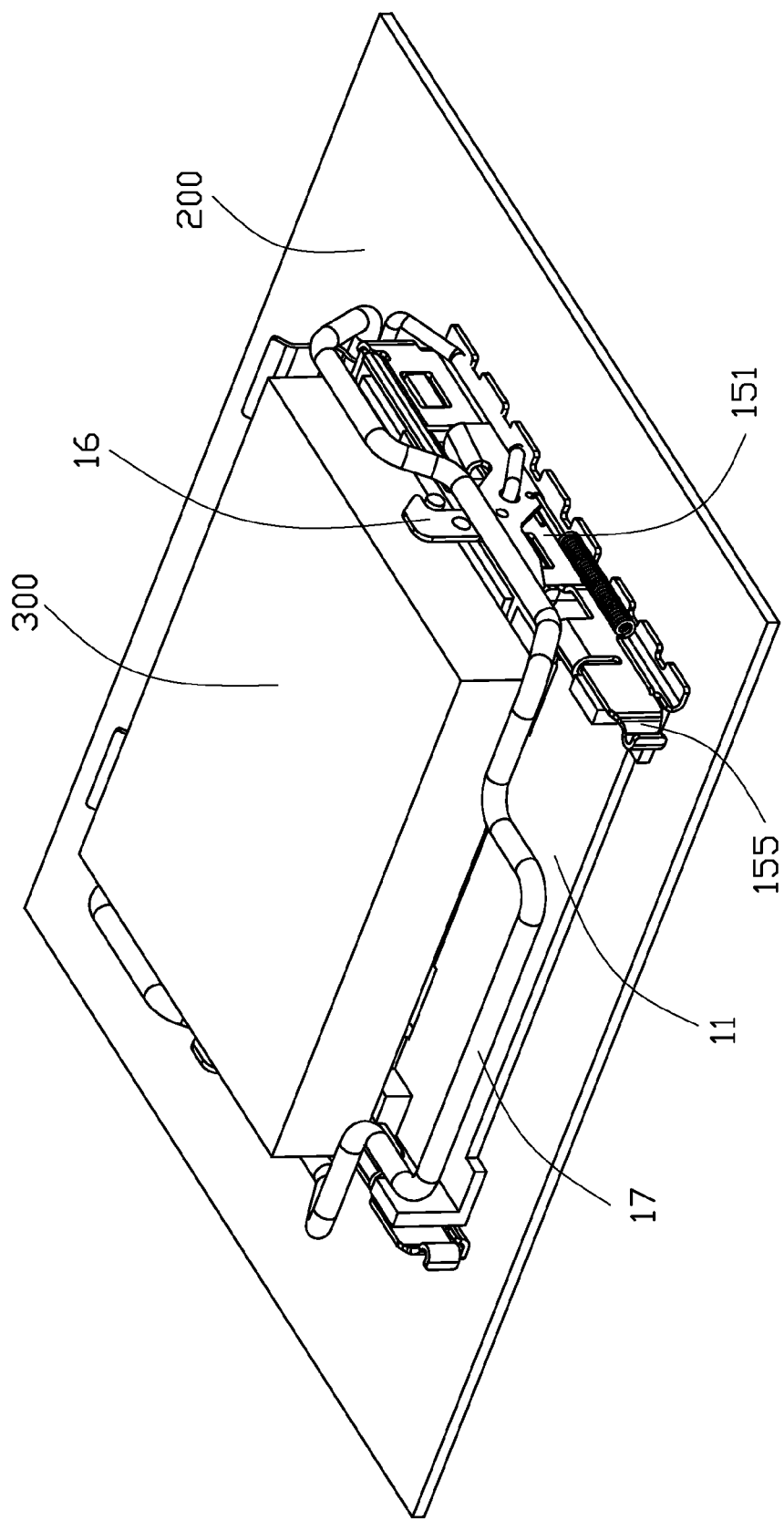
FIG. 6 is an assembled perspective view of the electrical connector assembly mounted to a printed circuit board in accordance with present invention, and the holding member is removed.
Figure 8:
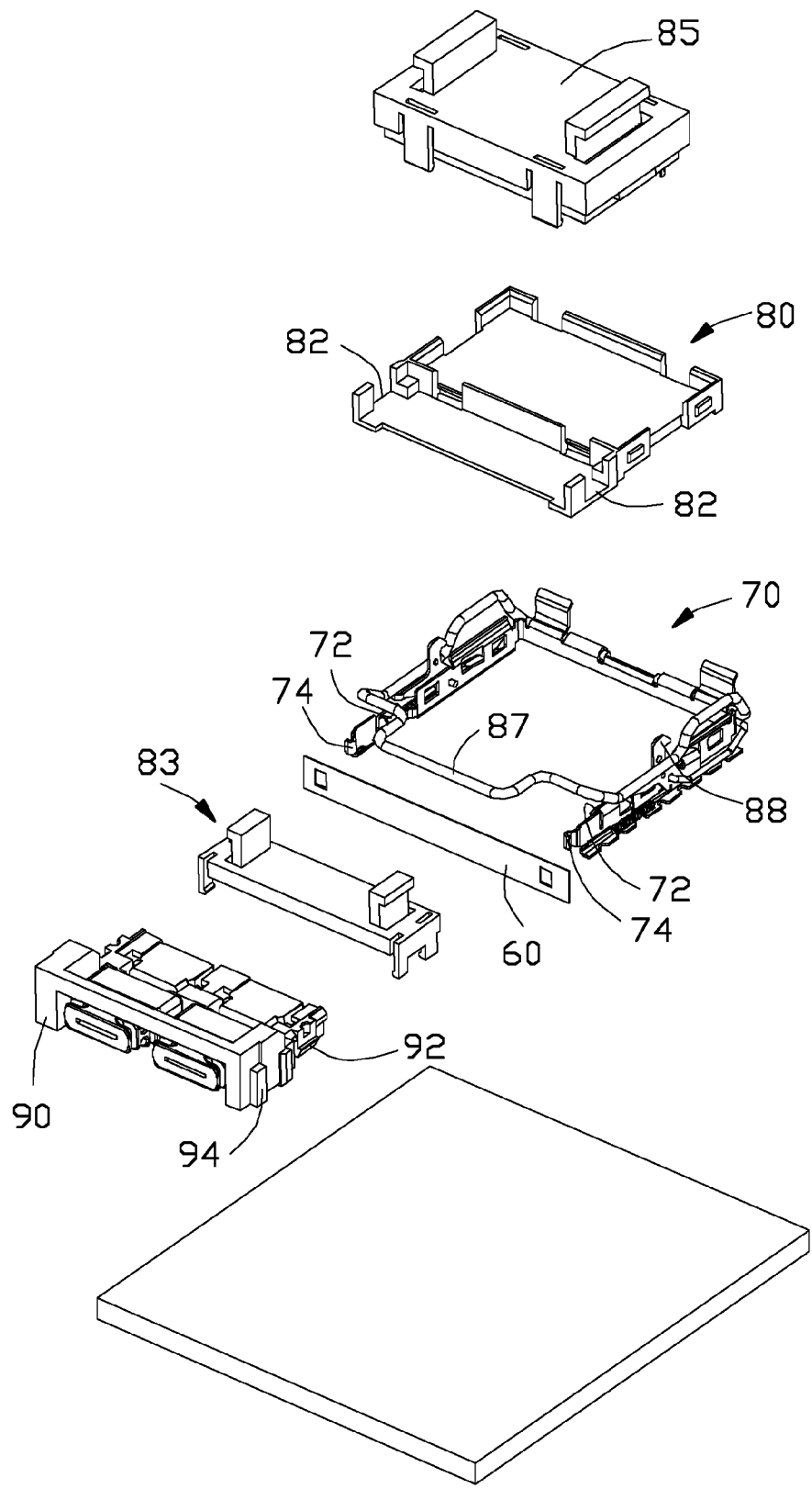
FIG. 8 shows the perspective view of another embodiment derived from the parent application.

The locking portions 155 of the frame 15 are clasping the locking holes 190 of the holding member 19, which ensures the size of the opening formed between the locking portions 155 does not change before the electrical connector assembly 100 is soldered to the printed circuit board. At the same time the connection between the holding member 19 and the frame 15 further enhances the floating connection between the frame 15 and the first insulating housing so as to avoid separation and loss. Referring to FIG. 6, after the electrical connector assembly 100 is soldered on the printed circuit board 200, the horizontal surface mounting regions of the supporting arms 151 of the frame 15 are soldered on the printed circuit board 200, so that the size of the opening will not be changed even if the holding member 19 is removed directly. Then an attachment element 90 as shown in FIG. 8, such as fiber, optical module or photoelectric conversion module, etc., is loaded in protrusion 11 of the first housing 11 along the top to bottom direction, the locking portions 155 of the frame 15 are clasping the attachment element. Finally, the heat sink 300 is retained to a top of the second housing 2 by retainers. When the electrical connector assembly 100 is at a closed status, the pressing portion 172 sits on the hook 1630 of the supporting portion 163 of the locking member 16, the claw 161 of the locking member 16 locks a pole 301 formed on a side of the heat sink 300, the pushing portion 1622 is below the clump 22 of the second housing 2, the electrical connector assembly 100 at this status can work normally.

When it is needed to change the electrical connector assembly 100 from the closed status to an open status, downwardly press the operation portion 171 of the lever 17 to rotate around the ends 170, and bring the pressing portion 172 to downwardly press the hook 1630 of the supporting portion 163, then cause the locking member 16 to rotate and release the pole 301 of the heat sink 300 from the claw 161; at the same time, the pushing members 1622 of the locking member 16 upwardly push the clumps 22 of the second housing 2 to separate the second housing 2 from the first housing 1, so that the heat sink 300 is easily taken away from the electrical connector assembly 100. Finally, release the lever 17, the springs 18 force the locking members 16 to rotate back and then bring the lever 17 to restore.

Figure 7:
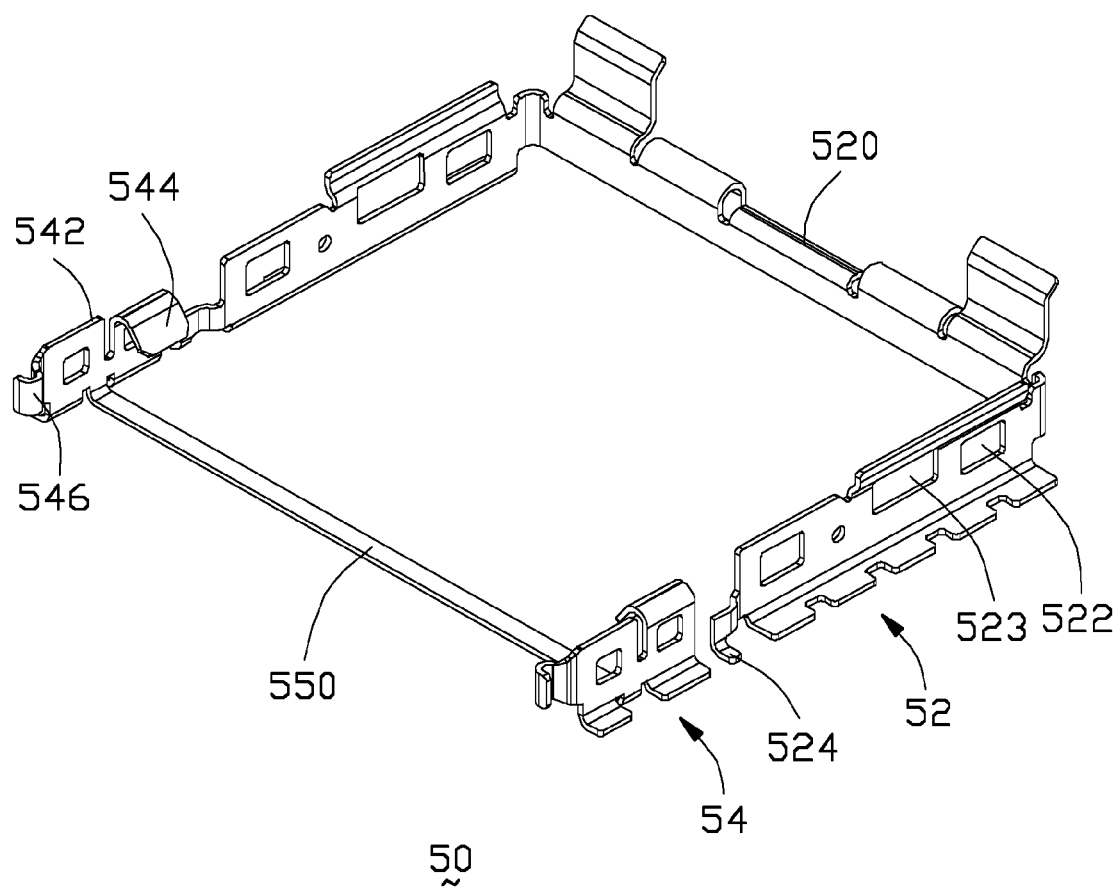
FIG. 7 is a perspective view of the frame of another embodiment of the invention.

FIG. 7 shows another embodiment of the frame 50 very similar to the frame 15 and including a primary part 52 and a second part 54. The primary part 52 includes a base 520, the through holes 522 attached upon the first housing 1 and soldering sections 524 for mounting to the printed circuit board, and the slot 523 for receiving the pushing portion 1622 of the locking member 16. The secondary part 54 includes a pair of supporting arms 542 spaced from each other in the transverse direction with a crossbar or holding member 550 linked therebetween. Each supporting arms 542 forming a latch 544 same with the latching 154 in the first embodiment for locking the corresponding attachment element or optical module 90 as shown in FIG. 8 in the vertical direction, and a locking portion 546 same with the locking portion 155 for locking the corresponding optical module 90 in the front-to-back direction. Understandably, on one hand because the holding member 550 is linked between the pair of supporting arms 542, it is impossible to have both the first part 52 and the second part 54 unitarily formed with each other as shown in the first embodiment. On the other hand, different from the first embodiment in which the holding member 19 is removed from the corresponding frame 15 after the connector assembly is soldered upon the printed circuit board for successively loading the optical module 90 into the housing 1, in this embodiment, the holding member 550 is located below the first housing 1 without hindrance to loading of the optical module 90, thus not requiring removal of the holding member 550 from the supporting arms 542 for later loading of the optical module 90.

FIG. 8 is derived from FIG. 6 of the parent application Ser. No. 14/320,892 with the additional holding member 60 optionally attached upon the frame 70 wherein the frame 70 mounted upon the printed circuit board (not labeled) surrounds the housing 80 which is mated with another housing (not labeled) under the cap 85. Notably, the cap 85 can be removed to allow the heat sink mechanism to be mounted upon the another housing with the relation between the heat sink 300 and the second housing 2 in the first embodiment. Also similar to the previous embodiment, the frame 70 is attached to the housing 80 and includes a pair of deflectable latches 72 to lock the optical module or jumper element 90 in the vertical direction and a pair of deflectable locking portions 74 in front of the latches 72 to lock the optical module 90 in the front-to-back direction wherein the optical module 90 is adapted to be downwardly loaded into the housing 80 in the vertical direction and to be horizontally withdrawn from the housing 80 in the front-to-back direction. Understandably, the latch 72 and the corresponding locking portion 74 are essentially operative separately without mutual influence wherein the locking portion 74 does not hinder downward loading of the optical module 90 and the latch 72 does not hinder forward withdrawal of the optical module 90. Another cap 83 is detachably attached to the optical module 90 for loading the optical module 90 into the housing 80. Correspondingly, similar to what is disclosed in the parent application, the optical module 90 includes a rear engagement region 92 for engagement with the latch 72, and a front engagement region 94 for engagement with the locking portion 74. Understandably, the optical module 90 forms a low profile not to interfere with the heat sink 300 when the optical module 90 is received within the housing 80. It is also noted that the housing 80 forms a pair of notches 82 to receive the corresponding latches 72 therein. Notably, referring to both FIGS. 6 and 8, the lever 87 will not hinder withdrawal of the optical module 90 from the housing 80 when the lever 87 is located in a horizontal position where the corresponding heat sink is locked by the locking member 88.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

We claim:

1. An electrical connector assembly, adapted for electrically connecting an IC package to a printed circuit board, comprising:
   a first housing for soldering on the printed circuit board and including a longitudinal body and a protrusion projecting forwardly from the body;
   a metallic frame formed and bent from sheet metal to form a U-shaped structure in a top view, said frame attached to and surrounding the first housing and defining a base and two supporting arms extending forwardly from two opposite ends of the base, each of said supporting arms forming soldering regions for mounting to the printed circuit board; and
   a holding member having two ends respectively connecting to the free ends of said two supporting arms so that a transverse dimension of an opening formed between the free ends of said two supporting arms is fixed; wherein
   the holding member is discrete from the frame and is removed after the frame is soldered on the printed circuit board.

2. The electrical connector assembly as claimed in claim 1, wherein the holding member defines a pair of locking holes disposed in said ends thereof, each of said supporting arms defines a locking portion at a free end thereof and clasping the corresponding locking hole of the holding member.

3. The electrical connector assembly as claimed in claim 1, wherein the electrical connector assembly further includes two locking members disposed on two sides of the frame, a pivot haulm supported by the frame reliably and a lever pivotally assembled relative to the frame, each locking member defines a circular hole via which the locking member is pivotally assembled to the frame.

4. The electrical connector assembly as claimed in claim 3, wherein an end of the haulm passes through the circular hole of the locking member and inserts into a pivoting hole defined on the frame so as to pivot the locking member to the frame.

5. An electrical connector assembly comprising:
an electrical connector including an insulative housing;
a metallic frame made from sheet metal and formed with a U-shaped structure with a base extending in a transverse direction and a pair of supporting arms forwardly extending from two opposite ends of the base in a front-to-back direction perpendicular to said transverse direction, said pair of supporting arms commonly defining, around two opposite front ends thereof, a pair of deflectable latches and a pair of deflectable locking portions in front of said pair of deflectable latches, a transverse opening formed between said two opposite front ends of said pair of supporting arms in said transverse direction; and
an optical module removeably assembled into the housing and including a rear engagement region adapted to be engaged with the pair of deflectable latches, and a front engagement region adapted to be engaged with the pair of deflectable locking portions; wherein
the optical module is configured to be removably assembled into the housing downwardly into the housing in exactly a vertical direction perpendicular to both said transverse direction and said front-to-back direction, and locked in position by an engagement between the rear engagement region and the latches in the vertical direction and by another engagement between the front engagement region and the locking portions in the front-to-back direction; wherein
said optical module is configured to be, along the front-to-back direction, removed forwardly from the housing through said transverse opening by disengagement between the locking portions and the front engagement region; wherein
in each of said supporting arms, said latch and the corresponding locking portion are located around the same front end thereof and separately operative from each other without mutual influence; wherein
the frame includes a first part and a second part discrete and spaced from each other in the front-to-back direction, and the second part is located around said two opposite front ends of the supporting arms; wherein
the second part includes a crossbar is unitarily linked between the two supporting arms and located under the housing so as not to hinder the transverse opening in said front-to-back direction.

6. The electrical connector assembly as claimed in claim 5, wherein each of said supporting arms includes a soldering region for mounting to a printed circuit board on which the housing is mounted.

7. The electrical connector assembly as claimed in claim 5, wherein a holding member is detachably attached upon the two opposite front ends of the supporting arms to block the transverse opening so as to assure correct positions of said pair of supporting arms during soldering the supporting arms upon the printed circuit board.

8. An electrical connector assembly comprising:
a printed circuit board;
an insulative housing mounted upon the printed circuit board;
a metallic frame attached to the housing at least partially circumferentially and soldered upon the printed circuit board, said frame including at least a pair of supporting arms spaced from each other in a transverse direction with a transverse opening around two opposite front ends thereof, said pair of supporting arms including a pair of deflectable latches and a pair of deflectable locking portions in front of said pair of deflectable latches in a front-to-back direction perpendicular to said transverse direction; and
an optical module removeably assembled into the housing and including a rear engagement region adapted to be engaged with the pair of deflectable latches, and a front engagement region adapted to be engaged with the pair of deflectable locking portions; wherein
the optical module is configured to be removably assembled into the housing downwardly into the housing in exactly a vertical direction perpendicular to both said transverse direction and said front-to-back direction, and locked in position by an engagement between the rear engagement region and the latches in the vertical direction and by another engagement between the front engagement region and the locking portions in the front-to-back direction; wherein
said optical module is configured to be, along the front-to-back direction, removed forwardly from the housing through said transverse opening by disengagement between the locking portions and the front engagement region; wherein
in each of said supporting arms, said latch and the corresponding locking portion are located around the same front end thereof and separately operative from each other without mutual influence; wherein
each of said supporting arms is further equipped with a pivotal locking member for locking a heat sink, and said locking member is actuated by a lever and resumed to an original position by a spring.

9. The electrical connector assembly as claimed in claim 8, wherein said locking member includes a pushing portion extending through a slot in the frame for upwardly urging the heat sink away from the housing.

10. The electrical connector assembly as claimed in claim 8, wherein said lever is located in a horizontal position without hindrance to forward removal of the optical module from the housing when the locking member locks the heat sink.

11. The electrical connector assembly as claimed in claim 8, wherein said housing includes a pair of notches to receive said pair of latches of the supporting arms therein.

12. The electrical connector assembly as claimed in claim 8, further including a holding member attached to around the two opposite front ends of said pair of supporting arms.

13. The electrical connector assembly as claimed in claim 12, wherein said holding member is removable from said two opposite front ends of said pair of supporting arms.

* * * * *